(12) United States Patent
Der et al.

(10) Patent No.: US 10,122,349 B1
(45) Date of Patent: Nov. 6, 2018

(54) MULTI-MODE POWER TRAIN INTEGRATED CIRCUIT

(71) Applicant: WiTricity Corporation, Watertown, MA (US)

(72) Inventors: Lawrence Der, Lexington, MA (US); Sanjay Gupta, Bedford, MA (US)

(73) Assignee: Witricity Corporation, Watertown, MA (US)

( * ) Notice: Subject to any disclaimer, the term of this patent is extended or adjusted under 35 U.S.C. 154(b) by 0 days.

(21) Appl. No.: 15/677,989

(22) Filed: Aug. 15, 2017

(51) Int. Cl.
*H03K 19/0175* (2006.01)
*H03K 3/356* (2006.01)
*H03K 19/094* (2006.01)
*H03K 19/017* (2006.01)
*G05F 3/20* (2006.01)
*H03K 19/003* (2006.01)
*H03K 17/10* (2006.01)

(52) U.S. Cl.
CPC ....... *H03K 3/356182* (2013.01); *G05F 3/205* (2013.01); *H03K 3/35613* (2013.01); *H03K 17/102* (2013.01); *H03K 19/00315* (2013.01); *H03K 19/01721* (2013.01); *H03K 19/09429* (2013.01)

(58) Field of Classification Search
CPC ......... H03K 3/356182; H03K 3/35613; H03K 17/102; H03K 19/00315; H03K 19/01721; H03K 19/09429; G05F 3/205
USPC ......................................................... 326/68
See application file for complete search history.

(56) References Cited

U.S. PATENT DOCUMENTS

| 7,215,146 B2* | 5/2007 | Khan ............... H03K 3/356113 326/68 |
| 2002/0125920 A1 | 9/2002 | Stanley |
| 2012/0154014 A1* | 6/2012 | Nakashima ...... H03K 3/356182 327/333 |
| 2012/0176162 A1 | 7/2012 | Heck |

OTHER PUBLICATIONS

Texas Instruments; LM5113 100 V 1.2-A / 5-A, Half-Bridge Gate Driver for Enhancement Mode GaN FETs; product manual; Jan. 2016; 26 pgs.; Dallas, Texas.

* cited by examiner

*Primary Examiner* — Daniel D Chang
(74) *Attorney, Agent, or Firm* — Gregory M. Howison

(57) ABSTRACT

A configurable driver integrated circuit is disclosed having a plurality of input/output terminals for interfacing exterior of the integrated circuit. The integrated circuit includes a plurality of driver circuits, with each driver circuit including a transistor having a source and a drain, and each of the source and drain thereof connected to a dedicated and respective one of the input/output terminals and further includes a gate driver for driving a gate of the transistor, with supply inputs associated with a floating voltage domain, and each driver circuit also includes a level shift circuit for shifting the level of a logic signal from a fixed voltage domain to the floating voltage domain. A switching circuitry generates switching signals in a fixed voltage domain for controlling the operation of each of the driver circuits in accordance with a predetermined configuration defined by external circuit.

19 Claims, 15 Drawing Sheets

MULTI-MODE POWER TRAIN INTEGRATED CIRCUIT

TECHNICAL FIELD

This application relates in general to Wireless Power Transfer (WPT) systems.

BACKGROUND

Wireless charging, also known as Wireless Power Transfer (WPT), is a technology that enables a power source to transmit electromagnetic energy to an electrical load across a gap, without interconnecting cords. Two directions for WPT are radiative wireless charging, which transfers energy via, for example, radiating electromagnetic, ultrasound, or acoustic waves and non-radiative charging, which transfers energy via an oscillating electromagnetic field.

The operation of the WPT requires both a Power Transmitting Unit (PTU) and a Power Receiving Unit (PRU) interface with each other through respective transmit and receive coils. The PTU includes a power generating unit that generates a DC voltage and converted to an AC voltage for driving the transmit coil. The transmit coil is typically configured as part of an H-bridge driver. Multiple different types of drivers can be utilized for realizing this H-bridge driver, such as Class D and Class E amplifiers.

SUMMARY

In one aspect of the present invention, a configurable driver integrated circuit is disclosed having a plurality of input/output terminals for interfacing exterior of the integrated circuit. The integrated circuit includes a plurality of driver circuits, with each driver circuit including a transistor having a source and a drain, and each of the source and drain thereof connected to a dedicated and respective one of the input/output terminals. Each driver circuit further includes a gate driver for driving a gate of the transistor, and having supply inputs associated with a floating voltage domain, and each driver circuit also includes a level shift circuit for shifting the level of a logic signal from a fixed voltage domain to the floating voltage domain. A switching circuitry is provided for generating switching signals in a fixed voltage domain for controlling the operation of each of the driver circuits in accordance with a predetermined configuration defined by external circuit components configuring the driver circuits in a predefined driver class to drive a reactive load.

BRIEF DESCRIPTION OF THE DRAWINGS

For a more complete understanding, reference is now made to the following description taken in conjunction with the accompanying Drawings in which.

DETAILED DESCRIPTION

Figure 1:
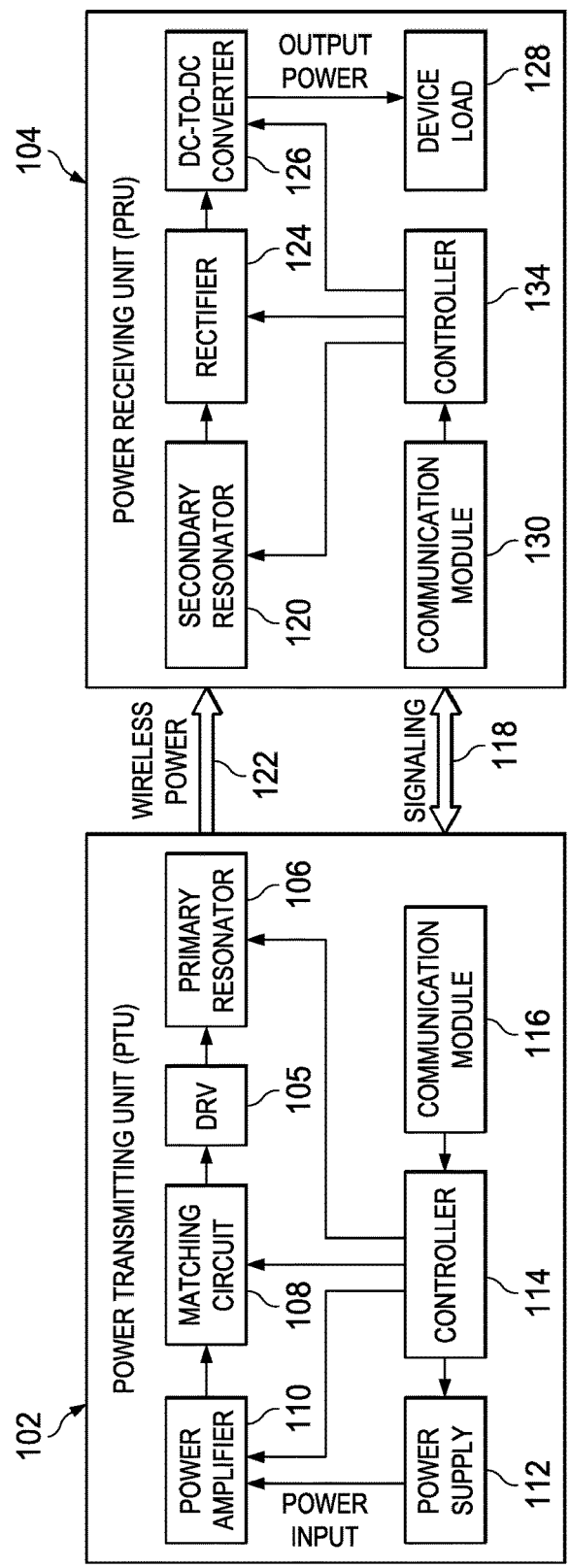
FIG. 1 illustrates an overall block diagram of a Wireless Power Transfer (WPT) system.

Referring now to the drawings, wherein like reference numbers are used herein to designate like elements throughout, the various views and embodiments of Multi-Mode Power Train Integrated Circuit are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to FIG. 1, there is illustrated a block diagram of an exemplary Wireless Power Transfer (WPT) system that includes a Power Transmitting Unit (PTU) 102 that interfaces with a Power Receiving Unit (PRU) 104. The wireless power is transferred from the PTU 102 to the PRU 104.

The PTU 102 includes a primary resonator 106 that generates an oscillating magnetic field to wirelessly transmit power to the PRU 104. A matching circuit 108 is provided for interfacing between a power amplifier 110 and the primary resonator 106 through a driver 105. A power supply 112 is provided for generating power from an external source for input to the power amplifier 110. A controller 114 is provided for controlling the power supply 112, the power amplifier 110, and the matching circuit 108 and the primary resonator 106. The controller 114 interfaces with a communication module 116 in order to communicate with the PRU 104 over a bidirectional signaling path 118.

The PRU 104 includes a secondary resonator 120 interfacing with the primary resonator 106 of the PTU 102 via a wireless power path 122. The output of the secondary resonator 120 is input to a rectifier 124 for rectifying the output to a DC level, which is then input to a DC-to-DC converter 126. This comprises the output power which is then input to a device load 128. It should be understood that multiple loads could be interfaced with the DC-to-DC converter 126. A communication module 130 is operable to interface with the PTU 102 and the communication module 116 associated therewith via the signaling path 118. A controller 134 is provided on the PRU 104 for interfacing with the secondary resonator 120, the rectifier 124, the communication module 130 and the DC-to-DC converter 126.

The communication modules 116 and 130 provide for feedback signaling between the PRU 104 and the PTU 102 for the purpose of controlling the charging operation. The wireless power is generated at approximately 6.78 MHz of the Industrial Scientific Medical (ISM) frequency band. The communication on the signaling path 118 can be facilitated, for example, over an out-of-band communication path for control signaling and operates at the 2.4 GHz ISM band. For example, this out-of-band communication path can be via Bluetooth (BLE), Wifi, or radio.

The PTU 102 can operate in multiple functional states. One functional state is the Configuration state in which the PTU 102 does a self-check, one is the PTU Power Save state, in which the PTU 102 periodically detects changes in impedance at the primary resonator and one is the PTU Low Power state, in which the PTU 102 establishes a data connection with PRU(s). Another state is the PTU Power Transfer state, in which the PTU 102 can regulate power transfer. Another is the Local Fault State, which happens when the PTU 102 experiences any local fault conditions such as over-temperature. Another is the PTU Latching Fault state, which happens when rogue objects are detected, or when a system error or other failures are reported.

The PRU 104 also has a number of functional states. One is the Null State, when the PRU 104 is under-voltage, one is the PRU Boot state, when the PRU 104 establishes a communication link with the PTU 102, one is the PRU On state, when communication is performed, one is the PRU System Error State, when there is an over-voltage, over-current, or over-temperature alert, or when there is an error that has to shut down the power.

An exemplary communication protocol, used to support wireless charging functionality, can be via a Bluetooth Low Energy (BLE) link for the control of power levels, identification of valid loads, and protection of non-compliant devices. There can be three steps in the communication protocol, the first being device detection, the second being information exchange, and the third being charging control. With respect to device detection, the PTU 102 can beacon power until a PRU 104 broadcasts advertisements. The PTU 102 can reply to the PRU advertisements with a connection request. The information exchange allows the PTU 102 and PRU 104 to exchange their static and dynamic parameters. The charging control is initiated when the PTU 102 can provide sufficient power to meet the demand requested from the PRU 104, or when the PRU 104 is authorized to receive energy.

Figure 2:
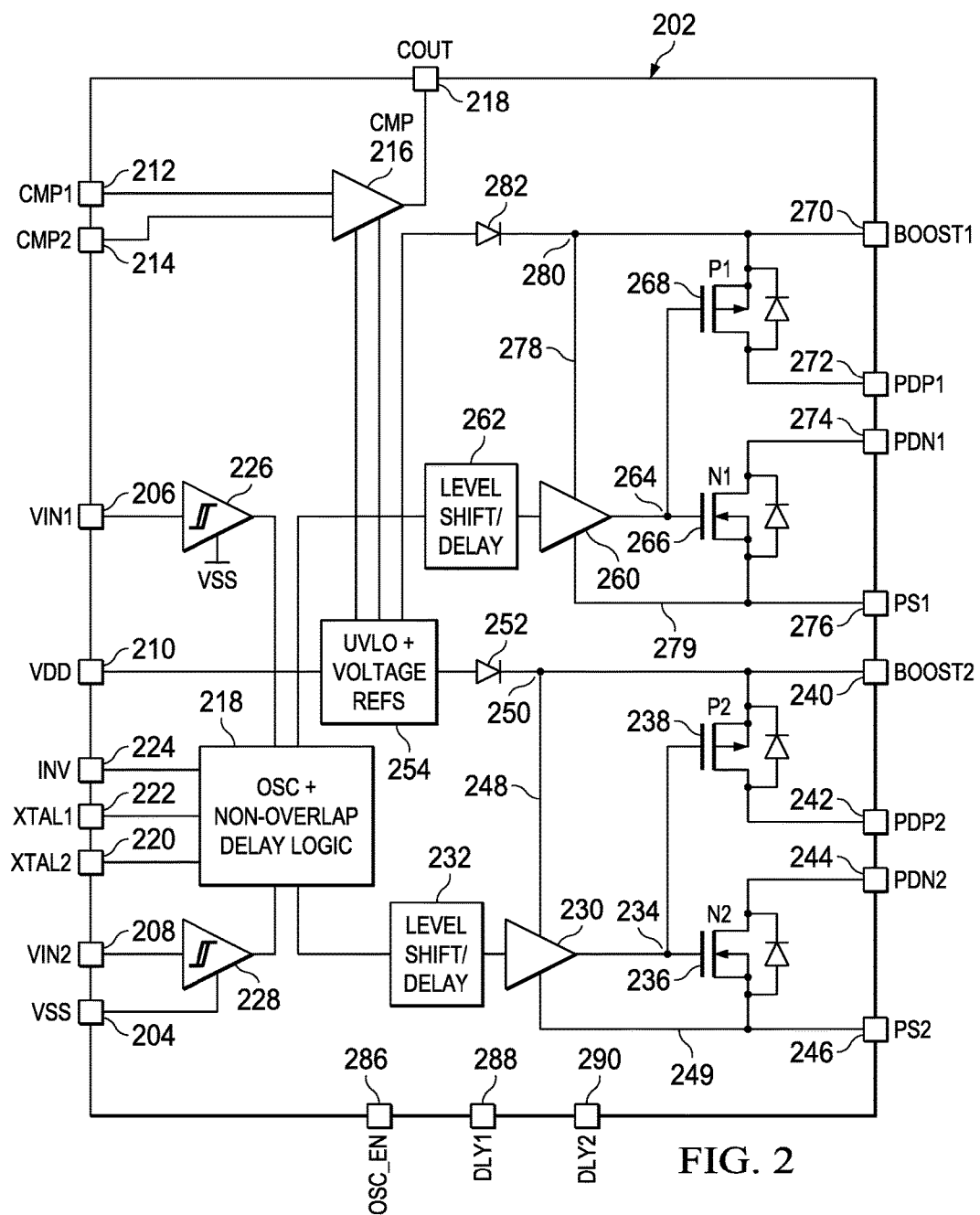
FIG. 2 illustrates a block diagram of a multi-mode power train IC PFET/NFET.

Referring now to FIG. 2, there is illustrated a block diagram of an integrated circuit (IC) chip 202 having multiple modes of operation to function as a standalone driver or as an amplifier to amplify a received input signal. The IC 202 has a VSS node 204 which is connected to multiple components on the IC 202. There are provided to AC input signal nodes 206 and 208, labeled VIN1 and VIN2, respectively. They are operable to receive a positive going signal and a negative going signal, respectively. There is provided a VDD input node 210 for receiving power to the IC 202. There are provided two comparator nodes 212 and 214 for sensing current across a series resistor connected external thereto. Each of these nodes 212 and 214 are input to respective inputs of a comparator 216. The output of the comparator is connected to an output node 218. An internal oscillator and non-overlap delay logic circuit 218 has three inputs connected thereto, two crystal inputs on nodes 220 and 222 for being connected to an external crystal and an inverting input on a node 224. A first positive driver 226, which is a Schmidt Trigger, has the input thereof connected to the positive going node 206 and the output thereof connected to the oscillator 218. A negative driver 228, which is a Schmidt Trigger, has the input thereof connected to the node 208 and the output thereof connected to the oscillator 218.

There are provided two symmetrical driver circuits. The first driver circuit is comprised of a gate driver 230 having the input thereof connected to the output of the oscillator 218 through a level shift/delay circuit 232 and the output thereof connected to a node 234. The node 234 drives the gate of an NFET 236 and to the gate of a PFET 238. The drain of the PFET 238 is connected to a boost output node 240, and the source thereof connected to a source node 242. The NFET 236 has the drain thereof connected to a drain node 244 and the source thereof connected to a source node 246. These nodes 240, 242, 244, and 246 are external nodes to the IC 202. Additionally, the gate driver 230 has the power supply input on a node 248 connected to a node 250, which is connected to the boost node 240 and the ground or VSS node on a line 249 connected to the source node 246. The node 250 is connected to the cathode of a diode 252, the anode thereof connected to the output of an Under Voltage Lockout (UVLO) and voltage reference circuit 254 that generates voltage references. The voltage reference generator 254 also provides references for the comparator 216. This voltage output to the anode of the diode 252 will typically be a voltage close to VDD at a voltage of approximately 5.0 V, as an example.

The second driver circuit is comprised of a gate driver 260 having the input thereof connected to the output of the oscillator 218 through a level shift/delay circuit 262 and the output thereof connected to a node 264. The node 264 drives the gate of an NFET 266 and the gate of a PFET 268. The drain of the PFET 268 is connected to a boost output node 270 and the source thereof connected to a source node 272. The NFET 236 has the drain thereof connected to a drain node 274 and the source thereof connected to a source node 276. These nodes 270, 272, 274, and 276 are external nodes to the IC 202. Additionally, the gate driver 260 has the power supply input on a node 278 connected to a node 280, which is connected to the boost node 270 and the ground or VSS node on a line 279 connected to the source node 276. The node 280 is connected to the cathode of a diode 282, the anode thereof connected to the output of the UVLO-reference circuit 254.

It is noted that both of the first and second drivers are configured such that, first, they are symmetrical and, second, that they are galvanically isolated from the power supply, i.e., they are basically operating on a floating power supply basis with the level shifters 232 and 262 shifting the voltage input thereto up from the voltage output by the oscillator and logic circuit 218.

There are provided a number of control inputs. There is provided an oscillator enable input 286 (OSC_EN) and two delay inputs 288 and 290, which two delay inputs 288 and 290 are input to control or define the delay in each of the level shift/delay surface 232 and 262, respectively.

Figure 3:
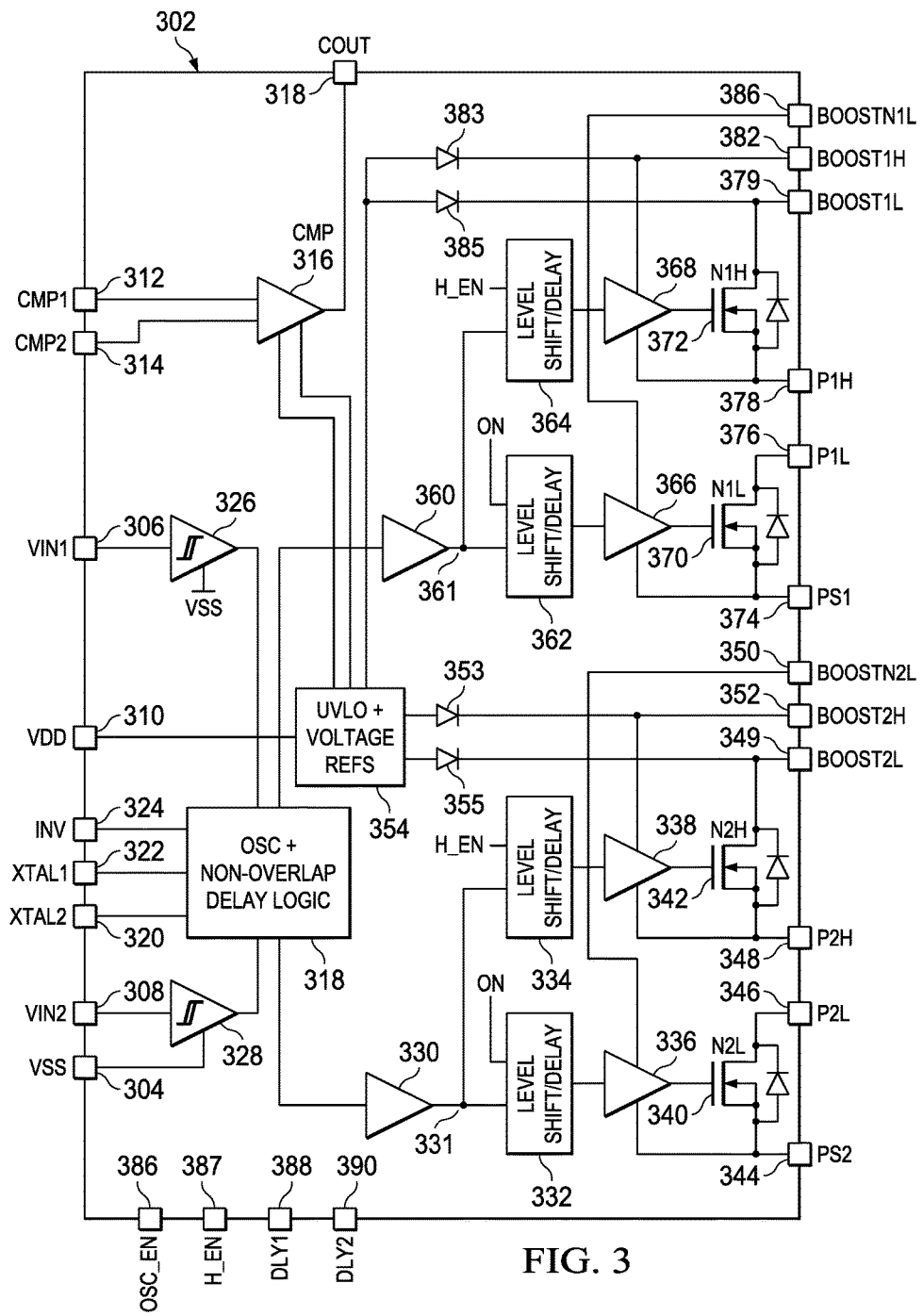
FIG. 3 illustrates a block diagram of a multi-mode power train IC with all NFET transistors.

Referring now to FIG. 3, there is illustrated a block diagram of a multi-mode power train IC 302 with all NFET power transistors, which is similar to IC 202. The IC 302 has a VSS node 304 which is connected to multiple components on the IC 302. There are provided to AC input signal nodes 306 and 308, labeled VIN1 and VIN2, respectively. They are operable to receive a positive going signal and a negative going signal, respectively. There is provided a VDD input node 310 for receiving power to the IC 302. There are provided two comparator nodes 312 and 314 for sensing current across a series resistor connected external thereto. Each of these nodes 312 and 314 are input to respective inputs of a comparator 316. The output of the comparator is connected to an output node 318. An internal oscillator and non-overlap delay logic circuit 318 has three inputs connected thereto, two crystal inputs on nodes 320 and 322 for being connected to an external crystal and an inverting input on a node 324. A first positive driver 326, which is a Schmidt Trigger, has the input thereof connected to the positive going node 306 and the output thereof connected to the oscillator 318. A negative driver 328, which is a Schmidt Trigger, has the input thereof connected to the node 308 and the output thereof connected to the oscillator 318.

There are provided two symmetrical driver circuits. The first driver circuit includes a first non-inverting driver 330 having the input thereof connected to the negative output of the logic circuit 318 and the output thereof connected to a node 331. The node 331 is connected through a first level shift/delay circuit 332 and the input of a second level shift/delay circuit 334. Each of the level shift/delay circuits 332 and 334 are controlled and interface to one of external delay nodes 388 and 390 to control the delay there through. The output of the first level shift/delay circuit 332 is provided to the input of a gate driver 336 and the output of the level shift/delay circuit 334 is provided to the input of the gate driver 338. Gate driver 336 drives the gate of an NFET 340 and the output of the gate driver 338 drives the gate of an NFET 342. The source of the NFET 340 is connected to a source node 344, which is also connected to the VSS of the gate driver 336 and the drain of NFET 340 is connected to a drain node 346. The source of the NFET 342 is connected to a source node 348, the drain thereof connected to a boost node 349. The VSS of driver 338 is also connected to the source node 348. The VDD input of the driver 336 is connected to a boost node 350 and the VDD input of the driver 338 is connected to a boost node 352. The boost node 352 and the VDD input to the driver 338 are connected to the cathode of a diode 353, the anode thereof connected to the output of a UVLO and reference voltage generator 354. The drain of the NFET 342 and the boost node 349 are connected to the cathode of a diode 355, the anode thereof connected to an output of the voltage reference generator 354.

It can be seen that both of the drivers 338 and 336, in addition to both of the NFET's 340 and 342, are galvanically isolated from the chip VDD and VSS. This will be described in more detail hereinbelow.

The first driver circuit includes a first non-inverting driver 360 having the input thereof connected to the negative output of the logic circuit 318 and the output thereof connected to a node 361. The node 361 is connected through a first level shift/delay circuit 362 and the input of a second level shift/delay circuit 364. Each of the level shift/delay circuits 362 and 364 are controlled and interface to one of external delay nodes 388 and 390 to control the delay therethrough. The output of the first level shift/delay circuit 362 is provided to the input of a gate driver 366 and the output of the level shift/delay circuit 364 is provided to the input of the gate driver 368. Gate driver 368 drives the gate of an NFET 370 and the output of the gate driver 368 drives the gate of an NFET 372. The source of the NFET 370 is connected to a source node 374, which is also connected to the VSS of the gate driver 366 and the drain of NFET 370 is connected to a drain node 376. The source of the NFET 372 is connected to a source node 378, the drain thereof connected to a boost node 379. The VSS of driver 368 is also connected to the source node 378. The VDD input of the driver 366 is connected to a boost node 386 and the VDD input of the driver 368 is connected to a boost node 382. The boost node 382 and the VDD input to the driver 366 are connected to the cathode of a diode 383, the anode thereof connected to the output of a UVLO and reference voltage generator 354. The drain of the NFET 372 and the boost node 379 are connected to the cathode of a diode 385, the anode thereof connected to an output of the voltage reference generator 384.

It can be seen that both of the drivers 368 and 366 in addition to both of the NFETs 370 and 372 are galvanically isolated from the chip VDD and VSS. This will be described in more detail hereinbelow.

Additionally, there is provided an oscillator enable input 386 (OSC_EN) and a High-side Enable control input 387. The oscillator enable input 386 is operable to enable the oscillator 318 to operate as an oscillator when a crystal is disposed across the nodes 322 and 320 of the IC 302. This will allow the oscillator to generate the positive and negative going signals. Thus, whenever the output of the oscillator is positive going, the driver 360 generates a positive pulse to turn on either of the transistors 372 and 370 and, whenever the oscillator is negative going, a pulse will be generated to drive the driver 330 to turn on either of the transistors 340 and 342. This will be described in more detail hereinbelow, but it will be appreciated that, whenever transistor 372 is on, transistor 370 will be off, and transistor 342 is off and transistor 340 is on to support full bridge operation, and the appropriate delays will be present during switching to prevent "shoot through" current. This provides for a standalone chip that generates a driving voltage. When the oscillator 318 is not enabled, the external signals are received on the VIN 2 and VIN1 nodes 306 and 308, respectively. This allows the external oscillator, which is a pulse width modulated signal, to generate a positive pulse on node 306 for the positive half of the cycle and a positive going pulse on the node 308 for the negative half of the cycle.

Figure 4:
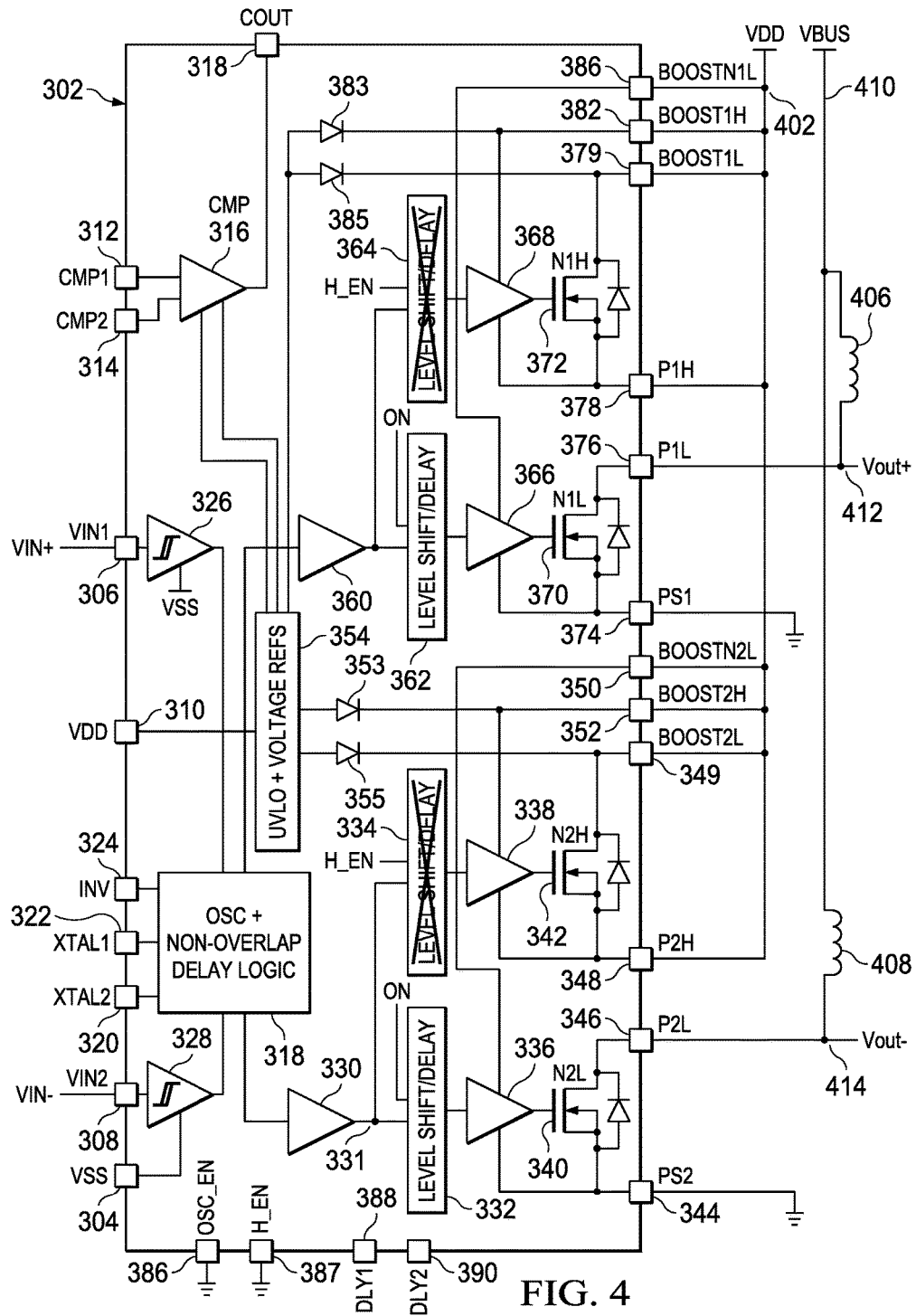
FIG. 4 illustrates a full-bridge Class E amplifier with internal NFETs.

Referring now to FIG. 4, there is illustrated an embodiment wherein the chip 302 is configured as a Class E amplifier. In this configuration, the amplifier 368 and the amplifier 338 are both disabled by forcing the control input H_EN on the node 387 to ground on the input pin 387. This disables the level shifter delay block 334. Additionally, the level shifter delay blocks 334 and 364 are disabled. The level shifter blocks 362 and 332, however, are enabled. Both the VDD and VSS supply voltages for the amplifiers 338 and 368 are connected to VDD by connecting the pins 348, 349, 378, and 382 to VDD.

As noted hereinabove, both of the amplifiers 336 and 366 are galvanically isolated and, in this configuration, VSS for each of the amplifiers 336 and 366 are connected to ground by connecting the pins 344 and 374 to ground. Both of the VDD inputs to the amplifiers 336 and 366 are connected to VDD via the pins 350 and 386. This is an external VDD on a node 402, which also constitutes the external VDD input to the chip on node 310.

There are provided two external coils 406 and 408, with coil 406 being connected on one side to external VBUS voltage on a node 410, which can be a much higher voltage than VDD. One side of each of the coils 406 and 408 are connected to node 410. The other side of coil 406 is connected to pin 376 on the drain side of transistor 370, and the other side of the coil 408 is connected to pin 346 on the drain side of transistor 340. In this configuration, the oscillator in the block 318 is disabled via the pin 386 being connected to ground. The pin 376 is connected to a $V_{out+}$ output node 412, and the pin 346 is connected to a $V_{out-}$ output node 414. This comprises the two outputs of the bridge.

In operation, when VIN+ on pin 306 goes high, this causes transistor 370 to be turned on by pulling the gate thereof low which will pull node 410 low placing the full voltage on node 410 across the inductor 406. At the same time, transistor 340 is turned off, with the input on VIN− pin 308 being pulled low, turning off transistor 340, which will allow output node 414 to be pulled high by the inductor 408. The non-overlap delay logic is controlled such that the transistor 370 and 340 are not both turned on at the same time. Thus, transistor 370 is turned on at one time, pulling node 412 low, and transistor 340 is turned off allowing node 414 to be pulled high by the coil 408. Thereafter, transistor 370 is turned off and transistor 340 is turned on to pull node 414 low to energize the coil 408.

Figure 5:
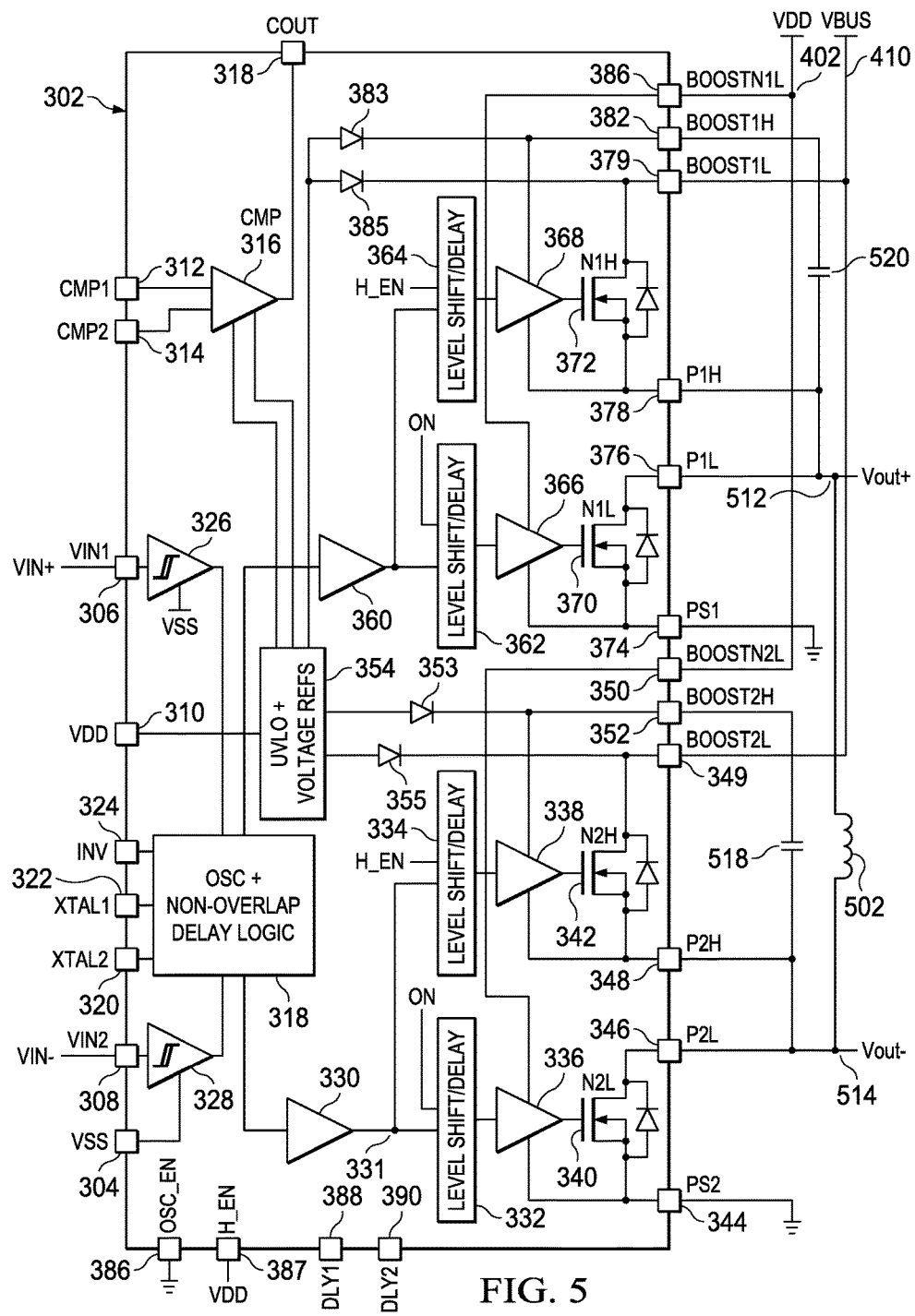
FIG. 5 illustrates a full-bridge Class D amplifier with internal NFETs.

Referring now to FIG. 5, there is illustrated a configuration of the chip 302 for a full bridge Class D amplifier. It is noted that the configurations of FIGS. 4 and 5 both utilize internal NFETs and, thus, are limited in power by the thermals of the chip, depending upon the size of transistors 340, 342, 370 and 372, the packaging and the process technology. In this configuration, all four of gates 336, 338, 366 and 368 are enabled. This is facilitated by connecting the High-side enable pin 387 to VDD. In this configuration, the oscillator is still disabled by connecting the pin 386 to ground. The VSS power supply lines for the amplifiers 336 and 366 are both connected to ground via the nodes 344 and 374. The VDD power supply lines for the amplifiers 336 and 366 are connected to VDD via the pins 350 and 386. The amplifiers 338 and 368, however, have a floating VSS wherein the pin 348 is connected to the pin 346, pin 346 connected to a $V_{out-}$ output node 514, and the VDD of amplifier 338 connected to one side of an external capacitor 518 via the pin 352, the other side of the capacitor 518 connected to the pin 348 and output node 514. The amplifier 368 has the VSS supply line connected to the pin 376 via the pin 378 and both connected to a $V_{out+}$ output node 512. The VDD supply line of the amplifier 368 is connected to one side of an external capacitor 520 via the pin 382, the other side of the capacitor 520 connected to the pin 378 and output node 512. Thus, in this configuration, both of the low side amplifiers 336 and 366 have supplies connected between VDD and VSS. An external coil 502 is connected between the output nodes 512 and 514.

In operation, the amplifiers 336 and 366 are operable to control transistors 340 and 370, respectively, to pull their respective nodes 514 and 512 low. Thus, these two amplifiers 336 and 366 operate out of phase with respect to each other. This is also similar with respect to the amplifiers 338 and 368 and a respective transistors 342 and 372. Thus, the logic block 318 will operate to turn on transistor 372 and 340 when VIN+ on input pin 306 goes high and turn off transistors 370 and 340 when VIN− on input pin 308 goes low. When VIN− on input pin 308 goes high and VIN+ on input pin 306 goes low, transistor 342 and 370 are turned on.

When either of the amplifiers 368 and 338 turn on transistors 372 and 342, respectively, each of the transistors 372 and 342 will respectively pull respective nodes 512 and 514 high. Specifically, with respect to transistor 372, when transistor 372 turns on, pin 378 will be pulled up to the voltage on VBUS on node 410, pulling output node 512 high. Also, as the drain of transistor 372 is connected to node 410 via pin 379, the drain of transistor 342 is also connected to node 410 via pin 349. Since pin 378 is connected to pin 376, the drain of transistor 370, which is now off, will also be pulled high to the voltage on VBUS on node 410. When transistor 372 is turned off, and node 512 pulled low by transistor 370, the VSS supply for amplifier 368 and the source of transistor 372 will be pulled low by transistor 370. The diode 383 will maintain the voltage on the top side of external capacitor 520 at the reference supply output by voltage reference block 354, typically VDD. When the transistor 370 is turned off and transistor 372 turned on, node 378 will be pulled to the voltage of VBUS and the capacitor 520 will boost the voltage on node 382 and the VDD voltage for amplifier 368 supply voltage above the voltage on VBUS, maintaining a floating VDD. Thus, output node 512 is switched between the voltage on node 410, VBUS, and ground. The non-overlap delay logic block 318 controls the operation such that when node 512 is pulled high, node 514 is pulled low and, when node 512 is pulled low, node 514 is pulled high. The delay logic ensures that the transistors 370 and 340 are out of phase with the respective transistors 342 and 372 and non-overlapping, so as to remove any shoot-through current from the high side transistor to the low side transistor.

Since the two amplifiers 338 and the 368 are associated with a "floating" power supply via the respective external capacitor 518 and 520, the input to each of the amplifiers 338 and 368 for this particular configuration has to be level shifted to a voltage range between the voltage on VSS and VDD for each of the respective amplifiers 338 and 368. The respective level shift/delay blocks 334 and 364 facilitate this level shift. As noted hereinabove, each of the level shift/delay blocks 332, 334, 362 and 364 has a selectable delay associated therewith via the pins 388 and 390. There are two delays available one for each of the two inputs, VIN+ and VIN−.

Figure 6:
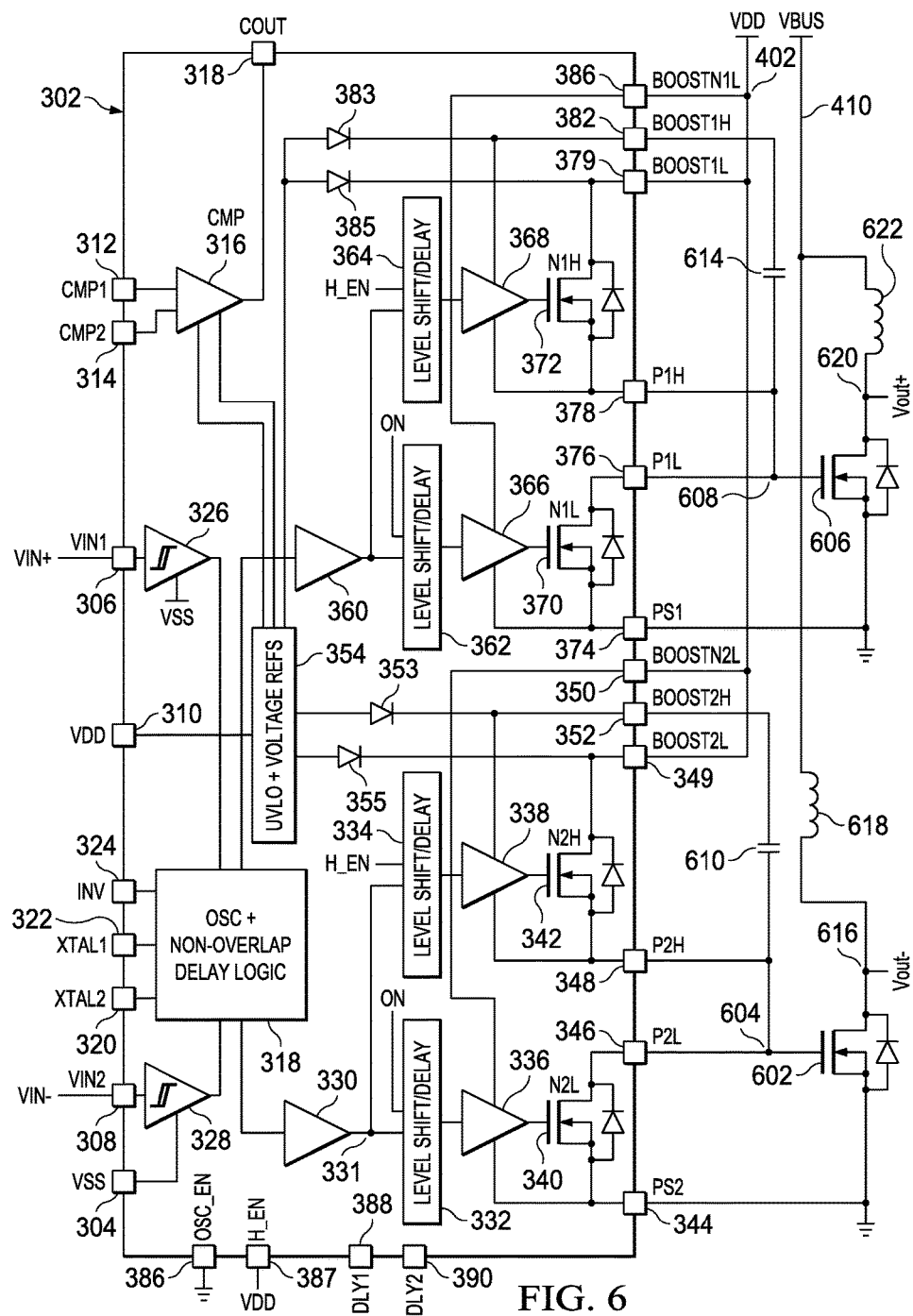
FIG. 6 illustrates a full-bridge Class E driver plus external NFETs.

Referring now to FIG. 6, there is illustrated a configuration for a full bridge Class E gate driver with external NFETs. In this configuration, as compared to the embodiment of FIG. 4, the amplifiers 338 and 368 are active, and the High-side enable signal on the pin 387 is connected to VDD. This means that the level shift/delay blocks 334 and 364 are enabled. In this configuration, the amplifiers 336 and 366 with their respective transistors 340 and 370 are connected similar to the connection and configuration in FIG. 4. The drain of transistor 340 is connected via the pin 346 to the gate of an external NFET 602 on a node 604. Similarly, the drain of transistor 370 is connected via pin 376 to the gate of an external NFET 606 on a node 608. Amplifier 338 has the VSS supply line connected via the pin 348 to the node 604, the source of the transistor 348 also connected to node 604 via pin 348. The VDD supply of the amplifier 338 is connected to one side of an external capacitor 610 via the pin 352, the other side of the capacitor 610 connected to the node 604. This capacitor 610 provides the floating supply for the amplifier 338. The pin 349 is connected to the VDD external supply on the node 402, to which the drain of transistor 342 is also connected. Similarly, the VSS supply of the amplifier 368 is connected via the pin 378 to the node 608, to which the source of transistor 372 is also connected. The VDD supply of the amplifier 368 is connected to one side of an external capacitor 614 via the node 382, the other side of capacitor 614 connected to node 608 and the source of the transistor 372. The drain of transistor 372 is connected via the pin 379 to the VDD supply on node 402.

The NFET 602 has the source thereof connected to ground on the pin 344 and the drain thereof connected to a $V_{out-}$ node 616. An external coil 618 is connected on one side thereof to the node 616 and on the other side thereof to the VBUS node 410, which is connected to an external supply which can be higher than VDD on a node 402. The external NFET 606 has the source thereof connected to ground and the pin 374 and the drain thereof connected to a $V_{out+}$ node 620. An external coil 622 is connected on one side thereof to the node 620 and on the other side thereof to the node 410 and the voltage on VBUS.

In operation, each of the amplifiers 336 and 366 and their respective transistors 340 and 370 operate similarly. With respect to the amplifier 336, when the input thereof is driven high the gate of transistor 340 is pulled high, pulling node 604 low, thus pulling the gate of NFET 602 low, turning off NFET 602. When node 604 is low, the lower plate of the capacitor 610 is also low and the upper plate thereof is charged via the diode 353 from the output of the voltage reference a block 354. When the NFET 602 is turned off, the coil 618 pulls the voltage on node 616 high. When the amplifier 336 changes state and turns off transistor 340 by pulling the gate thereof low, the gate of transistor 342 is raised high turning on the transistor 342. This will pull the node 348 up to the voltage on the node 349, which is VDD on node 402. When node 604 goes up to VDD, the voltage on the capacitor 610, it being a floating power supply, increases the voltage on the VDD supply input to the amplifier 338 to one VDD above VDD, or twice the supply voltage (assuming that the voltage on node 402 is VDD). This maintains the gate of the transistor 342 higher than the drain, thus maintaining conductance in the transistor 342, it being noted that the level shift/delay block 334 maintains the input to the amplifier 338 at a voltage above the voltage on node 348. This thus shifts the data input to a range between the voltage on node 348 and the voltage on node 349. The amplifiers 366 and 368 operate similarly to the amplifiers 336 and 338 except that they are out of phase therewith. Thus, when the input voltage VIN+ is high, the switching control signals will be configured by the logic block 318 to turn on transistor 606, the external NFET. This requires transistor 370 to be turned off and transistor 372 to be turned on. During that time, NFET 602 is turned off, and transistor 340 is turned on and transistor 342 is turned off. The appropriate delays and dead times are controlled by the logic block 318 in order to ensure that external NFETs 606 and 602 are not turned on at the same time nor are any of the pairs of transistors 340/342 or 370/372 turned on at the same time.

Figure 7:
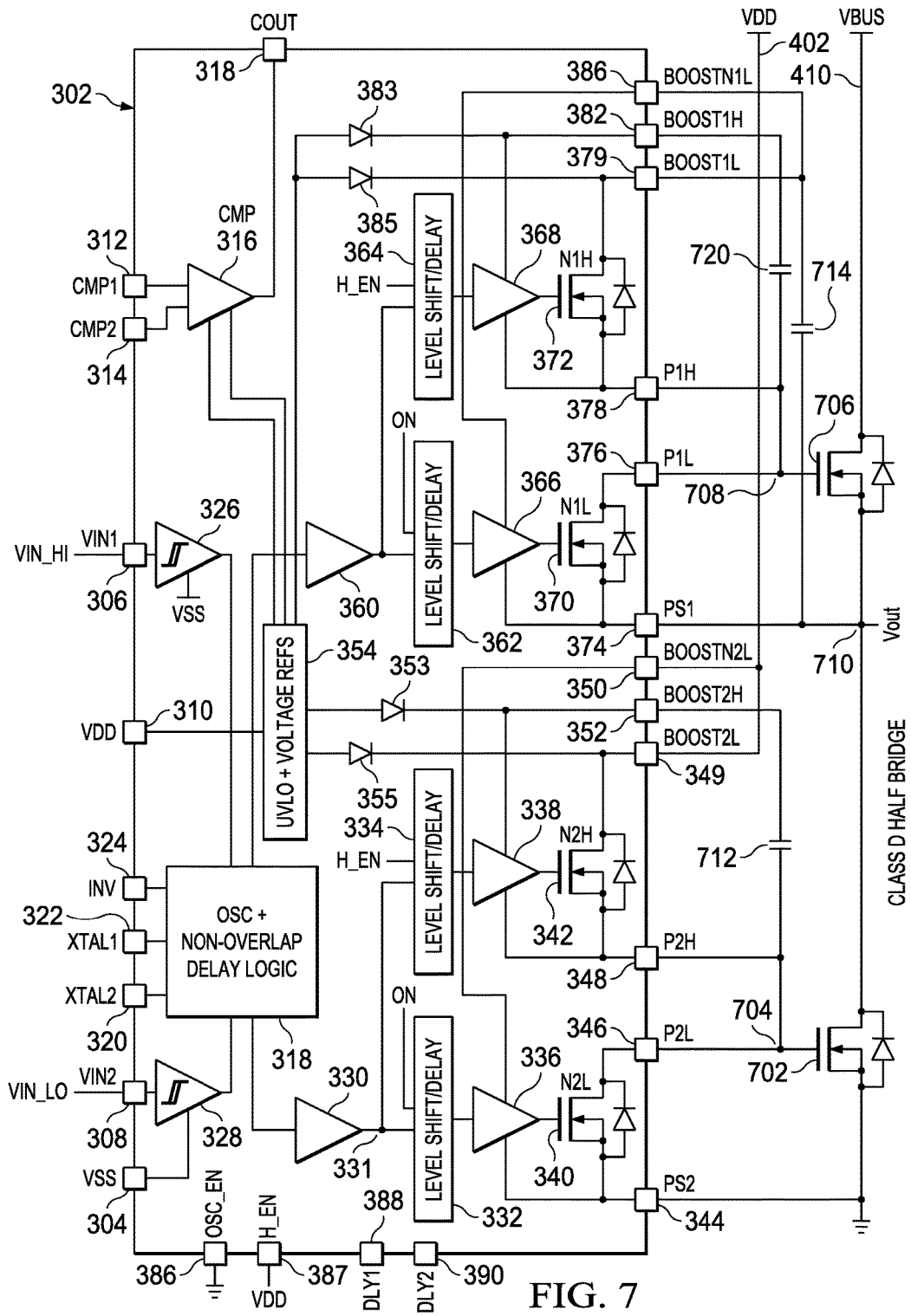
FIG. 7 illustrates a half-bridge Class D driver plus external NFETs.

Referring now to FIG. 7, there is illustrated a configuration for the chip 302 to realize a Class D half bridge driver with external NFETs. This differs from the embodiment of FIG. 5 in that it utilizes the external NFETs instead of internal NFETs and it is a half bridge. The amplifier 336 is configured similar to that in FIG. 5 in that amplifier 336 is connected with the supply voltage between the VDD and VSS. The drain of transistor 340 is connected to the gate of an external NFET 702 on a node 704. Node 704 is connected to the pin 346. Thus, the gate of NFET 702 on node 704 can be pulled low with transistor 340. The amplifier 338 is configured with its VSS supply connected via node 348 to node 704 and the VDD supply thereof connected via node 352 to one side of an external capacitor 712, the other side thereof connected to the node 704. The transistor 342 has the source thereof connected to the node 704 via the pin 348 and the drain thereof connected to VDD via pin 349. Thus, the supply voltage of the first 338 floats with capacitor 712. When transistor 340 is turned off and transistor 342 is turned on, node 704 is pulled to VDD at a supply voltage of amplifier 338 is boosted to two times the supply voltage VDDA. This basically pulls node 704 up to VDD. The level shift/delay block 334 maintains the input to the amplifier 338 within the range of the voltage across the capacitor 712.

The amplifier 366 drives the gate of the transistor 370, the source thereof connected via the pin 374 to the output node 710 and the drain thereof is connected via the pin 376 to drive the gate of an external NFET 706 on a node 708. The VSS supply voltage of amplifier 366 is connected via pin 374 to the output voltage node 710 and the source of the transistor 370 is also connected output node 710. The VDD supply of amplifier 366 is connected via pin 386 to one side of an external capacitor 714, the other side thereof connected to the output node 710. The pin 386 is connected to the pin 379, which is connected to the cathode of the diode 385, which will conduct when the top side of the capacitor 714 is below the voltage on the anode of the diode 385.

The amplifier 368 has the VSS supply connected through the pin 378 to node 708 and the source of transistor 372 is connected to the node 708 through pin 378. The VDD supply of amplifier 368 is connected via pin 382 to one side of an external capacitor 720, the other side thereof connected to the node 708. The drain of transistor 372 is connected via node 379 to the top side of capacitor 714 and pin 386. Thus, amplifier 336 is associated with the non-floating power supply, whereas amplifiers 338, 366 and 368 are all associated with floating power supplies.

The external NFET 702 has the source thereof connected to ground and the drain thereof connected to a voltage output node 710. The NFET 706 has the source thereof connected to the node 710 and the drain thereof connected to the VBUS voltage on node 410.

In operation, external NFET 702 is controlled by amplifiers 336 and 338. The node 306 is associated with an input voltage VIN_HI, and the input pin 308 is associated with an input voltage VIN_LO. When the voltage on node 306 goes high, this will turn on external NFET 706 and turn off external NFET 702. To turn off external NFET 702, amplifier 336 pulls the gate of transistor 340 high turning on transistor 340, and amplifier 338 pulls the gate of transistor 342 low turning off transistor 342 to pull node 704 low. This will pull the node 348 to ground through transistors 340, and a node 352 will be pulled down to approximately VDD output supplied by the reference voltage block 354. The external NFET 706 is turned on by the amplifier 366 pulling the gate of transistor 370 low, and the amplifier 368 pulls the gate of transistor 372 high turning on transistor 372 to pull node 378 up to the voltage on node 379. Capacitors 714 and 720 will have a voltage across them of approximately VDD volts as supplied by the reference voltage block 354 via diodes 385 and 383, respectively assuming negligible drop across the diodes. Therefore, in this switched state, the output voltage Vout, node 710, is at the VBUS voltage because transistor 706 is turned on. The voltage at the gate node of transistor 706 is approximately VDD+VBUS because transistor 372 is turned on which connects the gate node of transistor 706 to the top plate of capacitor 714, while the bottom plate of capacitor 714 is connected to the source of external transistor 706 via node 710. At the same time, amplifier 368 applies a voltage of approximately 2*VDD+VBUS to the gate of transistor 372 allowing it to turn on since the supply voltage of amplifier 368 is connected to the top plate of external capacitor 720 which is a VDD voltage above the gate voltage of the external transistor 706 due to the stored VDD voltage across capacitor 720 from the previous state. This maintains transistor 372 in a conductive state, since the level shift delay block 364 maintains the logic state on the input to the amplifier 368 at a logic high.

When the voltage on the input pin 306 goes low and the voltage on the input pin 308 goes high, this turns off external NFET 706 and turns on external NFET 702. This requires amplifier 336 to turn off transistor 340, and amplifier 338 to turn one transistor 342, connecting the node 704 to the voltage VDD on the pin 349. To ensure that the amplifier 338 is in a fully operating state during this operation of turning on external NFET 702, the VDD supply is boosted up to a level of VDD above the voltage on the pin 348. Similarly, external NFET 706 is turned off by the amplifier 366 turning on transistor 370 and connecting the gate of external NFET 706 on node 708 to the output voltage pin 710. When the amplifier 368 turns off transistor 372, the voltage across the capacitor 720 will be the voltage between the node 710, which is ground, and the voltage on the cathode of diode 383. The voltage across the capacitor 714 will also be the voltage between the voltage on the node 710, which is ground, and the voltage on the cathode of the diode 385, allowing capacitors 714 and 720 to charge to approximately VDD volts.

Thus, it can be seen that this configuration for the half bridge Class D driver requires one of the amplifiers 336, 338, 366, and 368 to have its power supply voltage connected between ground and VDD and the other three amplifiers 338, 366, and 368 connected to floating power supplies.

Figure 8:
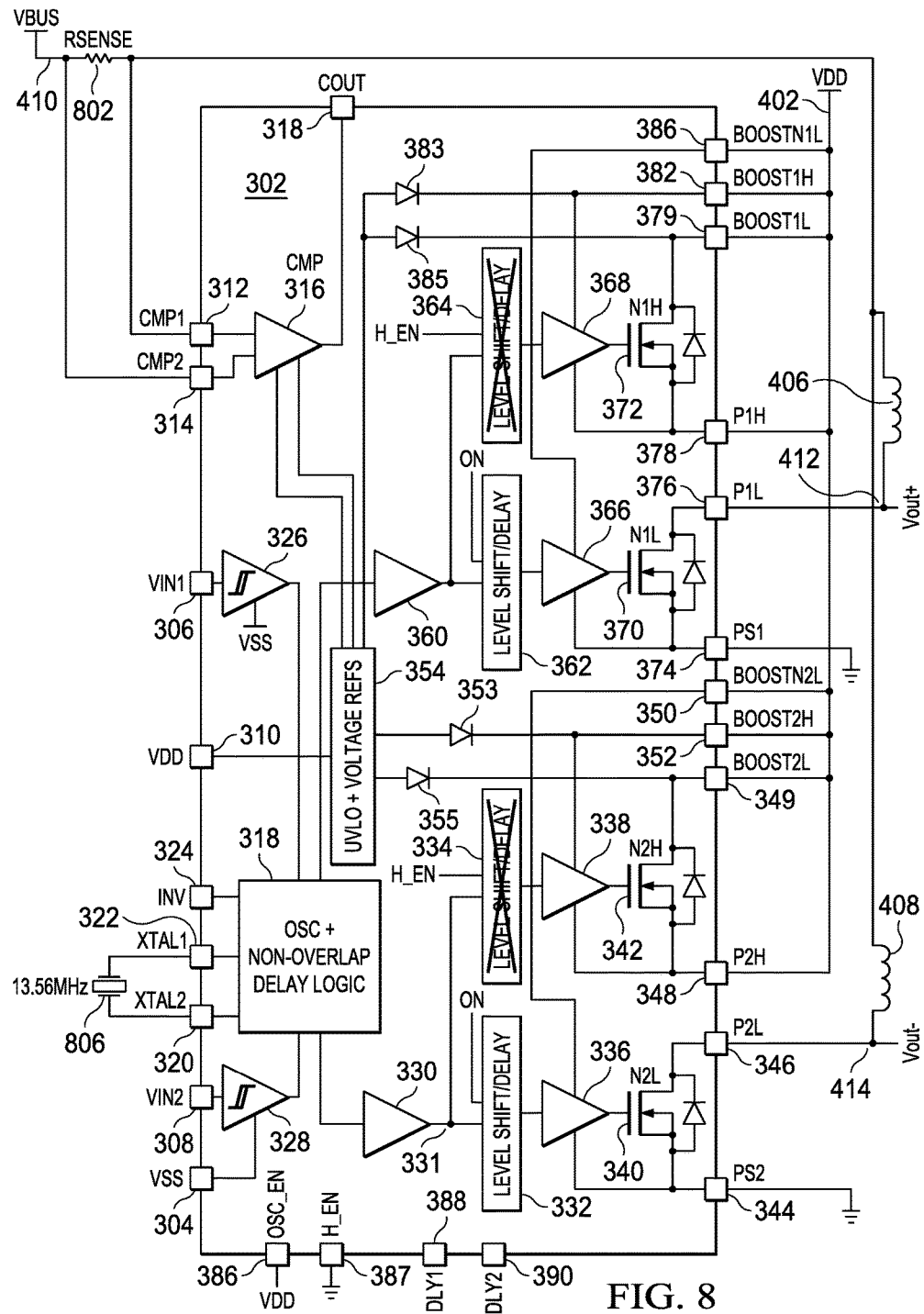
FIG. 8 illustrates a low-cost PTU full-bridge Class E plus internal NFETs.

Referring now to FIG. 8, there is illustrated a configuration that is identical to that of the configuration of FIG. 4, describing a self-contained PTU consisting of a full bridge Class E amplifier with internal NFETs. The only difference is that the non-overlap delay logic block 318 is configured to operate with a crystal 806 connected between the pins 322 and 320. The oscillator enable input on the pin 386 is connected to VDD. This internally then generates the gate control signals for the transistors 340 and 370, wherein the transistors 342 and 372 are disabled from operation. This is a self-contained power generation circuit which is constrained only with the power level that can be accommodated by the size of the transistors 340 and 370. For a typical chip this might be approximately 20 W. A voltage sense resistor 802 is disposed in series with the VBUS voltage on the node 410, with opposite sides of the resistor 802 being connected to the pins 312 and 314 on the input to the comparator 316. Comparator 316 is symbolic and the actual implementation can consist of multiple comparators. The purpose of the comparator is (1) to notify users of an error condition (2) shut down the circuitry when an error condition exists and (3) shutdown the circuitry when it detects that the PRU has been removed. The error conditions are over current draw which is detected by the external resistance 802 and over temperature which is detected by comparing the PTAT voltage from the voltage reference block 354 with an internally generated voltage that represents the over temperature voltage. Also, it should be noted these comparators will have hysteresis. The error indicator is represented by pulling down a resistor that could be connected to the comparator output pin COUT 318. To detect removal of a PRU device, the comparator can sense the current via RSENSE via the voltage drops and can shut down the circuitry when it detects a low value voltage which would represent a low current due to the removal of the PRU device.

In the operation of this device, the chip 302 requires nothing more than external configuration of the pins, a crystal and two coils 406 and 408 to function as a standalone free running PTU to charge an external device. In this operation, all that is required is for the device to be turned on via an external switch (not shown) which can connect VDD to the chip 302. The actual driving voltage to the coils 406 and 408 can be the voltage on the VBUS at node 410, which can be an external supply. With VDD to power the chip 302 and an external supply VBUS, a free running power generator is provided for generating wireless power. There is no feedback to regulate the power, however. A user will have to rely upon the actual external device itself and possibly any warning that might be generated by the comparator 316, noting that the device will have safety protection for over current and over temperature.

Figure 9:
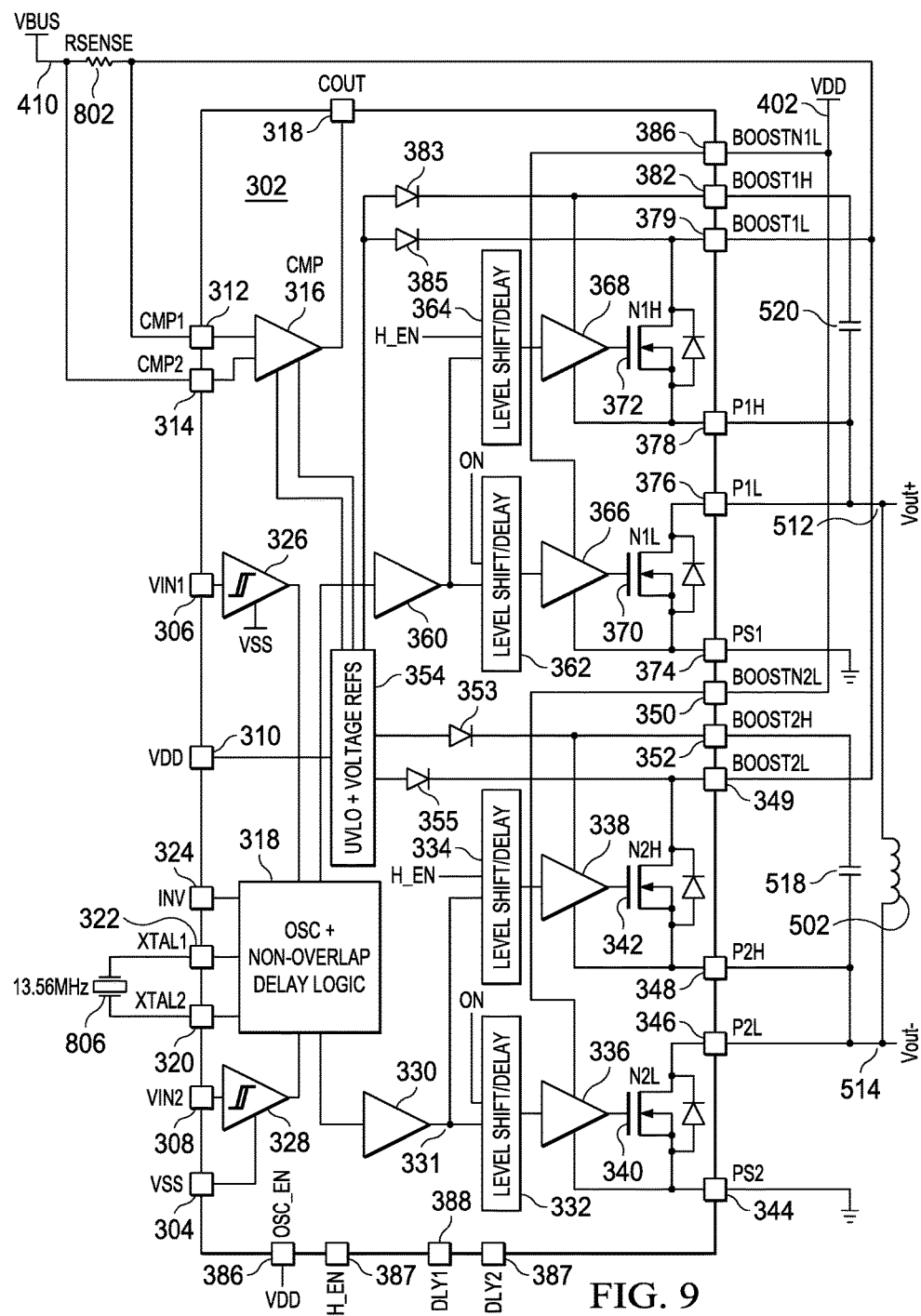
FIG. 9 illustrates a low-cost PTU full-bridge Class D plus internal NFETs.

Referring now to FIG. 9, there is illustrated a self-running PTU consisting of a full bridge Class D amplifier similar to the configuration of FIG. 5 with the exception that the oscillator is enabled and a crystal 806 is included. This configuration allows all four of the amplifiers 336, 338, 366, and 368 to be enabled in order to drive the output coil 502 in accordance with the operation as described hereinabove with respect to the embodiment of FIG. 5. This, again, as noted hereinabove with respect to the embodiment of FIG. 8, provides a free running power generator for getting generating power derived from the external generator on VBUS on node 410.

Figure 10:
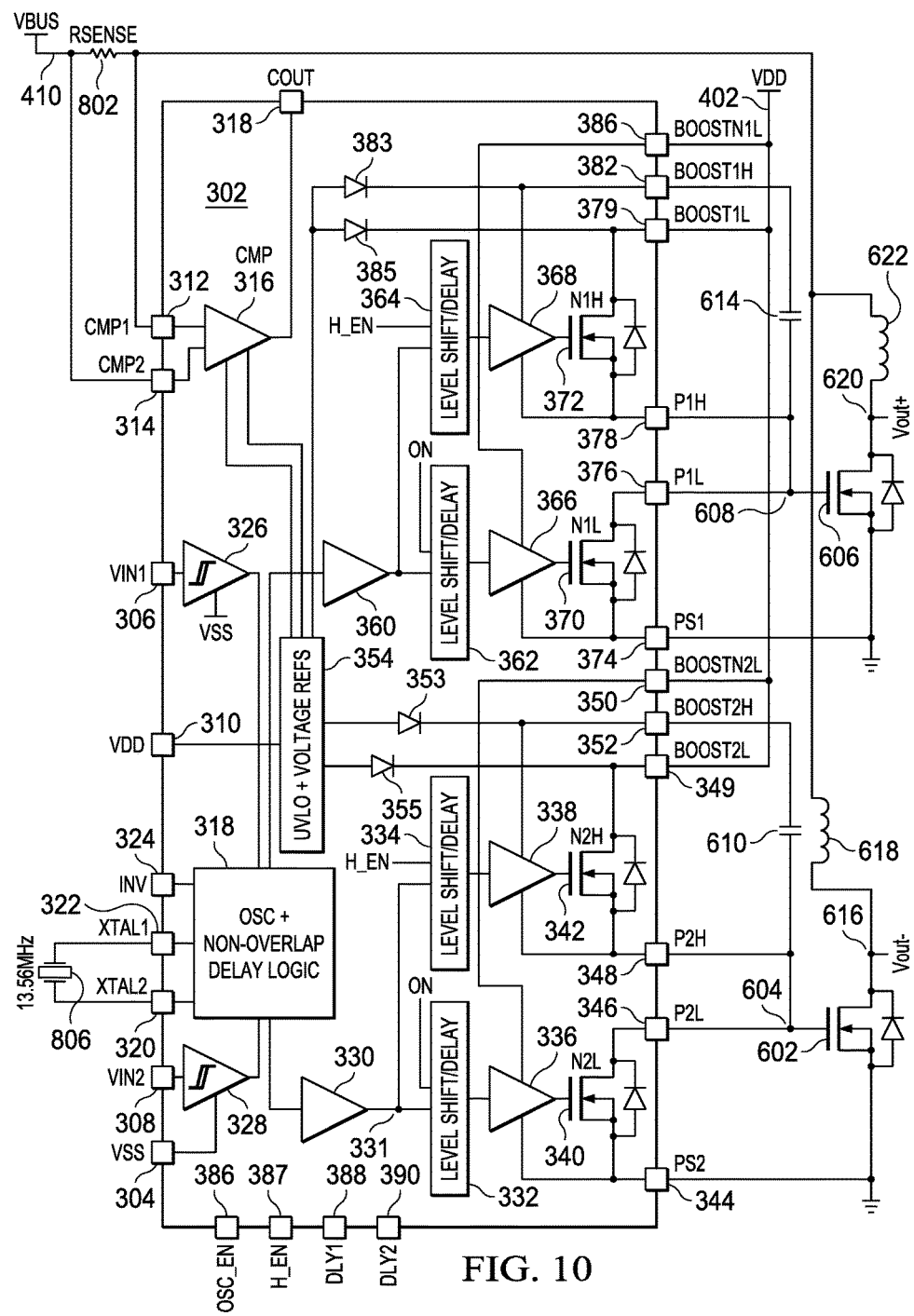
FIG. 10 illustrates a low-cost PTU full-bridge Class E plus external NFETs.

Referring now to FIG. 10, there is illustrated a self-running PTU consisting of a full bridge Class E amplifier similar to the configuration of FIG. 6 with the exception that the oscillator is enabled and a crystal 806 is included. This configuration allows all four of the amplifiers 336, 338, 366, and 368 to be enabled in order to drive the output coils 618 and 622 in accordance with the operation as described hereinabove with respect to the embodiment of FIG. 6. This, again, as noted hereinabove with respect to the embodiment of FIGS. 8 and 9, provides a free running power generator for getting generating power derived from the external generator on VBUS on node 410.

Figure 11A:
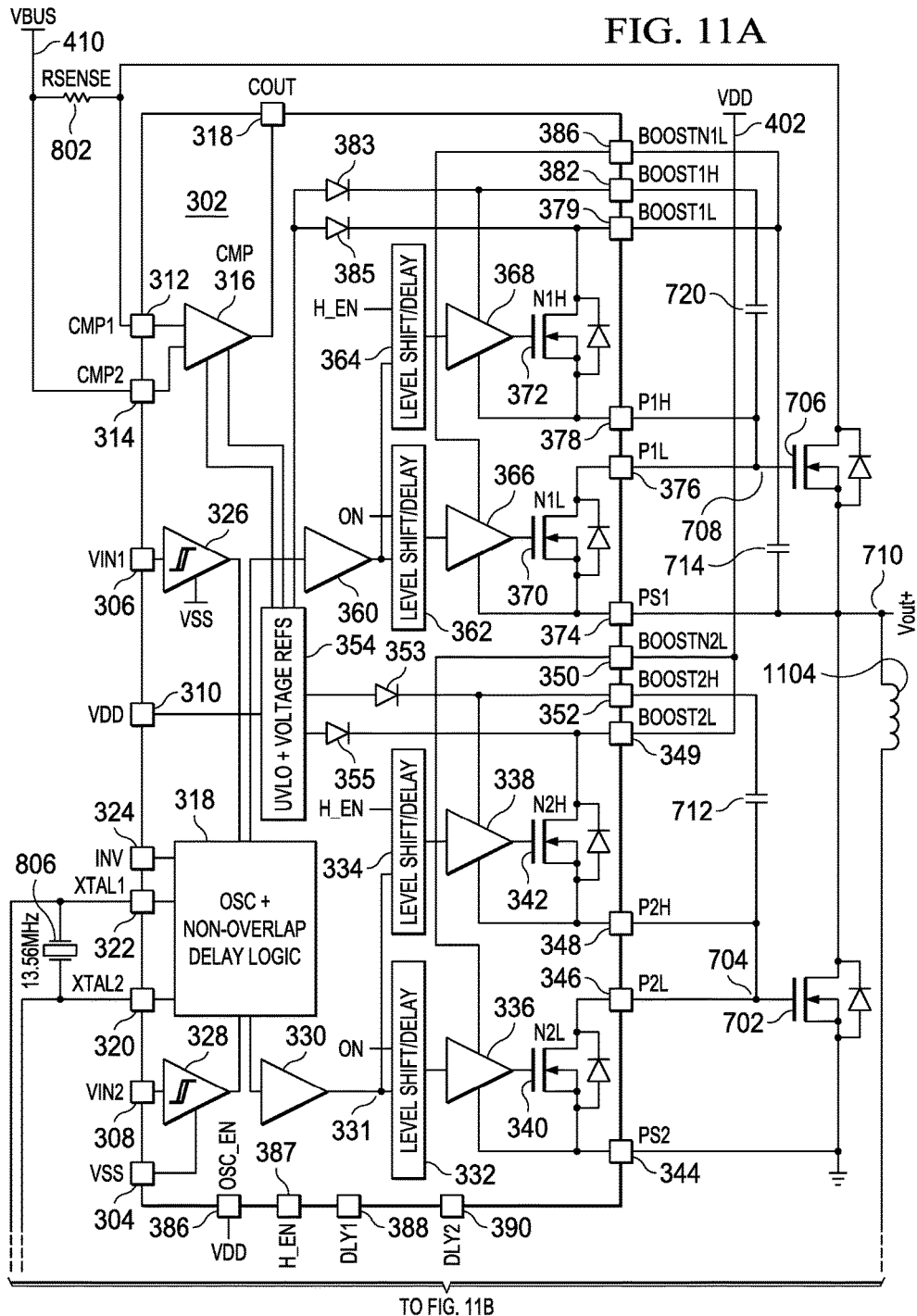
FIGS. 11A and 11B illustrate a two chip full-bridge Class D plus external NFETs.
Figure 11B:
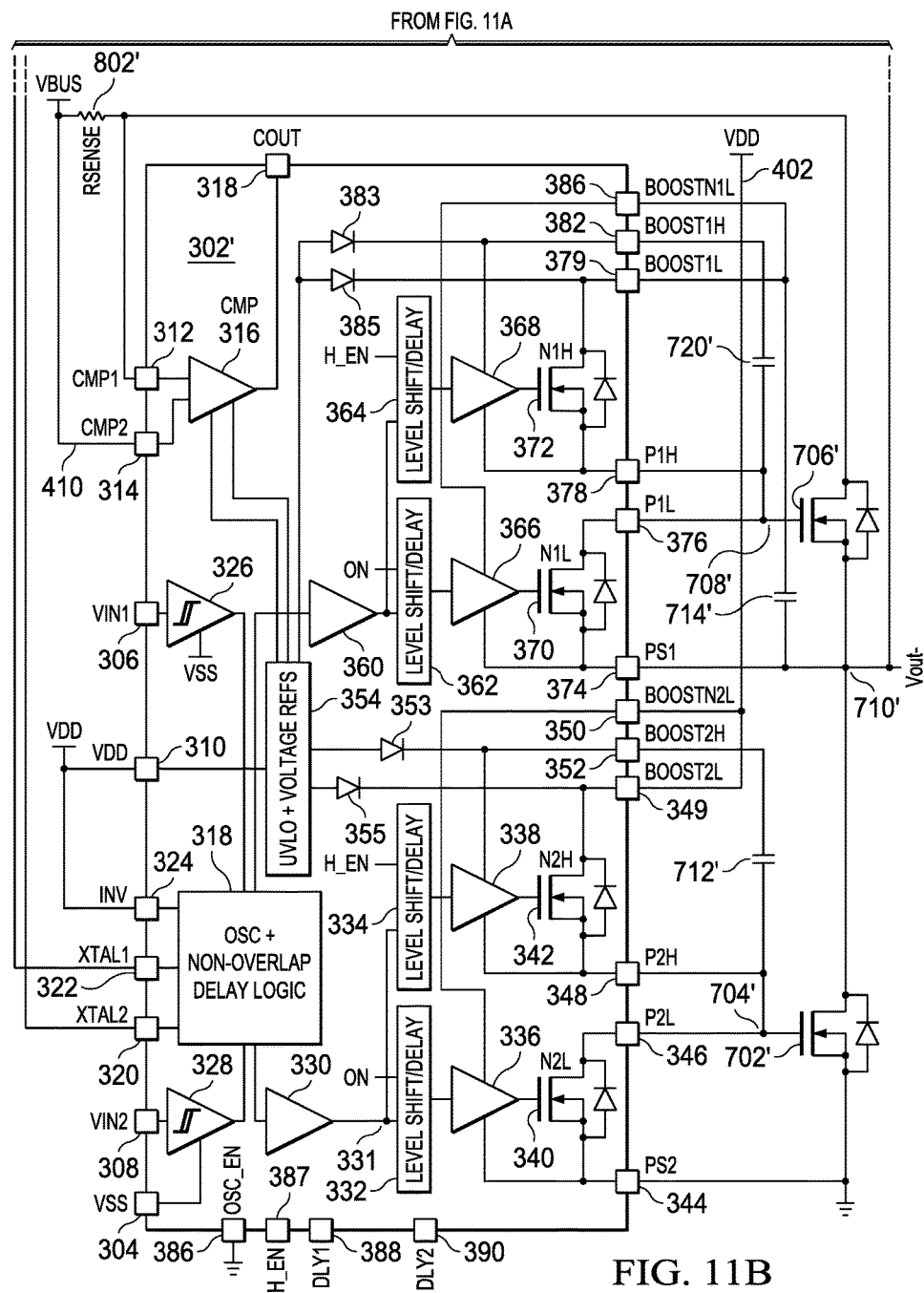

Referring now to FIGS. 11A and 11B, there is illustrated a two chip PTU solution utilizing two half bridge Class D amplifiers to drive opposite sides of a coil 1104. Each of the configurations for each of the chips is substantially identical to that illustrated with respect to FIG. 7 utilizing external NFETs, but could equally utilize internal NFETs. FIG. 11A illustrates a single chip 302 and FIG. 11B illustrates a single chip labeled 302'. Externally, the configurations are identical with respect to the external components, which are labeled with a "prime" indication to distinguish the two configurations. Additionally, the inverting input on the pin 324 on the chip 302' is connected to VDD to invert the polarity thereof. Therefore chip 302' operates 180° out of phase with respect to chip 302. There is only a single crystal 806 utilized for this two-chip configuration, with the pin 322 on chip 302 connected to the pin 322 on chip 302' and the pin 321 on chip 302 connected to the pin 320 on chip 302' and the crystal 806 connected therebetween. The oscillator enable pin 386 on chip 302' is connected to ground such that the oscillator is not enabled on chip 302', and it's output node 320' is high impedance allowing chip 302 to drive the crystal 806 and with some additional capacitive load from chip 302'. Thus, in operation, external NFET 706 is, in one half of the cycle, turned on to drive the output pin 710 to the voltage on VBUS pulling the associated side of coil 1104 high to the voltage on VBUS and external NFET 702 turned off. In the same half of the cycle, external and NFET 702' is turned on to pull the other side of the coil 1104 to ground and transistor 726' is turned off. In the second half of the cycle, this is reversed and external and NFET transistor 702 turned on and external NFET 706 turned off to pull node 710 low, and external and NFET 702' turned off and external NFET 706' turned on to pull node 710' up to the voltage on VBUS.

Figure 12:
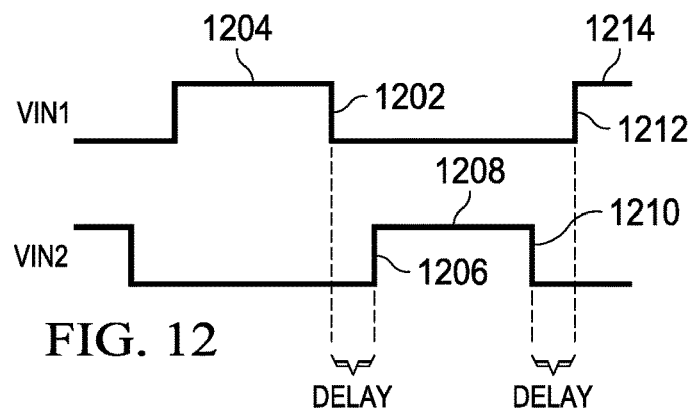
FIG. 12 illustrates a timing diagram for the non-overlapping drive pulses.

Referring now to FIG. 12, there is illustrated a timing diagram for the two non-overlapping pulses that constitute the VIN1 and VIN2 inputs. For the externally controlled mode wherein an external signal is input to, for the embodiment FIG. 3, Schmidt trigger 326 and the Schmidt trigger 328, the overlapping pulses are generated external. It is noted that the VIN1 and the VIN2 are generated such that the trailing edge 1202 of the pulse 1204 of the signal VIN1 precedes the leading edge 1206 of the pulse 1208 of the signal VIN2 by a predetermined delay similarly, the falling edge 1210 of the pulse 1208 precedes the leading edge 1212 of the next pulse 1214 of the signal VIN1. When the IC is configured as set forth in FIG. 10 wherein the oscillator is enabled and the crystal 806 is connected, the non-overlap delay logic and oscillator circuit generates not only the two driving pulses illustrated in FIG. 12, but it also generates the two delays. These delays prevent any overlap between the time that the driver 360 is driving the upper transistor pair and the driver 330 is driving the lower transistor pair. This prevents any shoot-through current. These delays are generated internally and can be programmable utilizing external programmable pins (not shown) and an internal register. They could also be preset.

Figure 13:
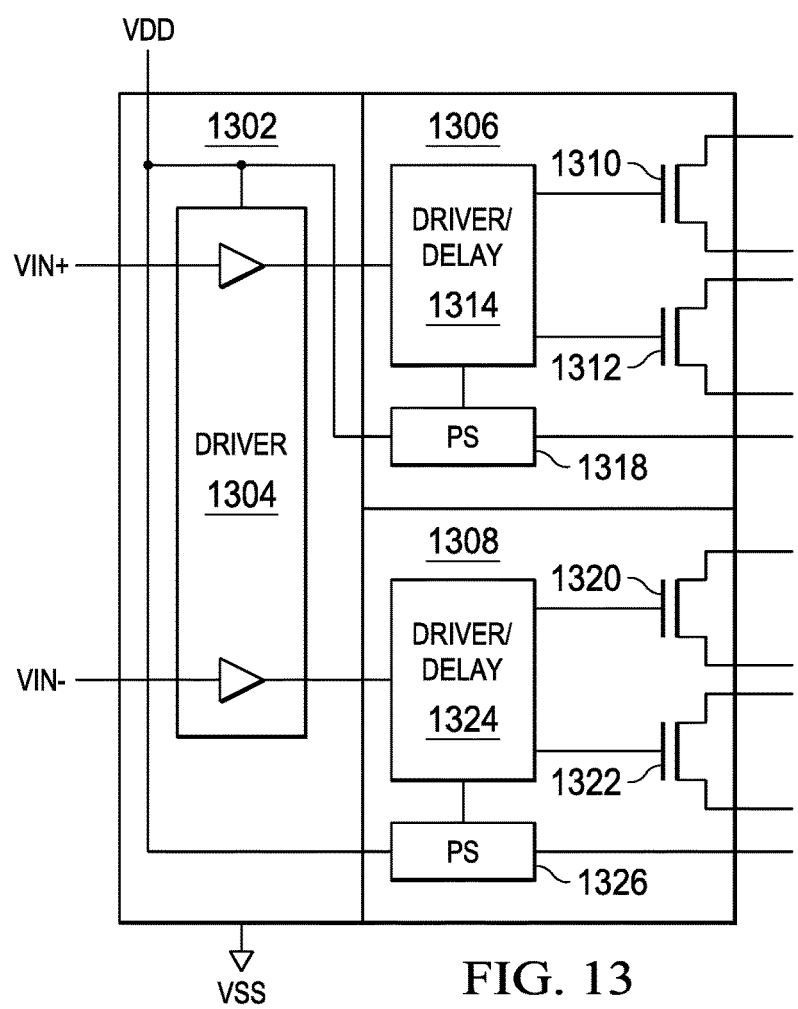
FIG. 13 illustrates a simple five block diagram of the reconfigurable multi-mode power train IC.

Referring now to FIG. 13, there is illustrated a simplified diagram of the multi-mode IC. In this simplified diagram, there are illustrated three distinct floating power supply domains. There is a fixed power supply domain associated with a first block 1302. This contains the driver circuitry associated with generating the drive signals output from the drivers 330 and 360 in FIG. 3 for the all NFET embodiment and the drivers 230 and 260 in FIG. 2 for the PFET/NFET embodiment. The overall driver circuitry is illustrated by a block 1304 wherein this block is powered by VDD, and external power supply. The ground is VSS. There are also provided two driver pair blocks 1306 for the high driver pair and 1308 for the low driver pair. The high driver pair block 1306 is illustrated as having two transistors 1310 and 1312 associated there with, the gates thereof being driven by a driver/delay block 1314 the driver/delay block 1314 driven by a floating power supply 1318, which receives power from the fixed power supply block 1302 and is also configurable external to the IC. This provides a floating power supply output for the driver/delay block 1314. Similarly, the low side driver 1308 includes a transistor 1320 and a transistor 1322, the gates thereof being driven by a driver/delay block 1324. The input to the driver/delay block 1324 is received from the driver 1304 in the fixed power supply domain block 1302. A floating power supply 1326 is provided that receives power from the VDD input in the fixed power supply domain block 1302 and is also configurable external to the IC and supplies a floating power supply to the driver/delay block 1324. Each of the transistors 1310, 1312, 1320 and 1322 have the sources and drains thereof connected to external terminals. Thus, each of the high and low side driver pairs not only have configurable transistors with the sources and drains connected to external terminals but also operate in separate floating power supply domains. They each receive respective high and low driving signals.

Figure 14A:
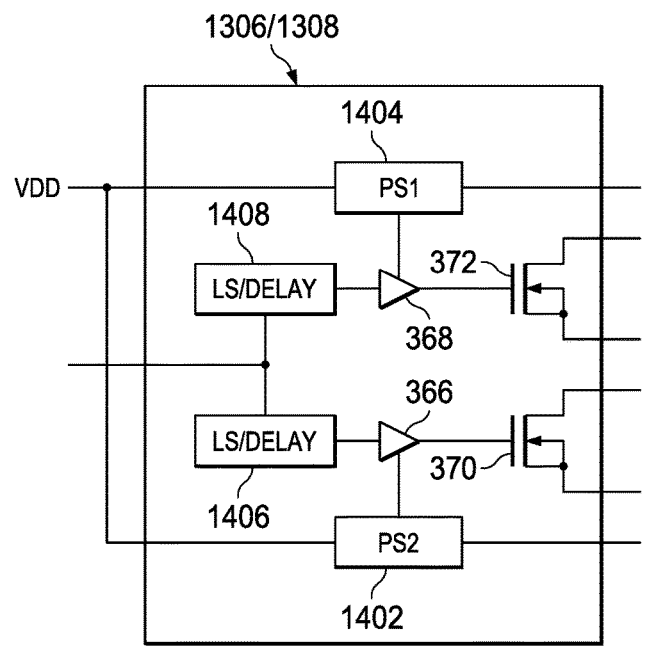
FIGS. 14A and 14B illustrate details of each of the level shifted driver pairs.

Referring now to FIG. 14A, there is illustrated a detailed block diagram of one of the high side and low side driver blocks 1306 and 1308 for an all NFET embodiment, illustrated above with respect to FIG. 3. In this embodiment, it can be seen that there are actually two drivers 366 and 368 which each have associated there with a respective floating power supply 1402 and 1404. Each of these floating power supplies 1402 and 1404 receive power from the fixed power domain block 1302 from VDD and have external connections for configurability. Thus, each of the driver blocks 366 and 368 can operate independent of the other for the transistor pair in that particular one of the high side and low side driver pair blocks 1306 and 1308. There is also provided a respective level shift/delay block 1406 and 1408 for driving the respective drivers 366 and 368 from a single input signal. Since each of the floating power supplies 1402 and 1404 operate independent of each other, these particular level shift/delay blocks 1406 and 1408 will operate in the respective floating power supply domain of each of the floating power supplies 1402 and 1404.

Figure 14B:
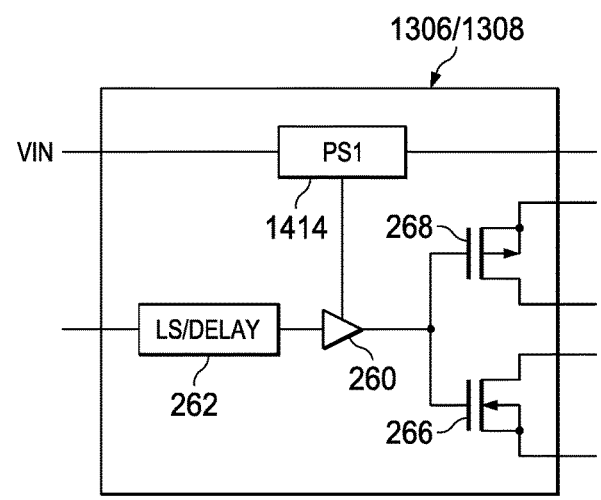

Referring now to FIG. 14B, there is illustrated a simplified schematic diagram for each of the high side and low side drivers 1306 and 1308 for the PFET/NFET embodiment of FIG. 2. The single driver 260 is associated with a floating power supply 1414, which is driven by the VDD signal from the fixed power supply domain of the block 1302 and configurable from an external connection. A single level shift/delay block 262 provides the input the driver 260 and wherein both of the gates of the NFET transistor 266 and the PFET transistor 268 are driven by the single driver 260. In this embodiment, both of the transistors in the transistor pair operate in the same floating power supply domain.

The primary advantage to the embodiment of FIG. 2 with the PFET/NFET configuration is that this requires less external compliments compared to the all NFET embodiment of FIG. 3. However, the performance of the PFET/NFET embodiment will not be as good as for the all NFET embodiment for the same die size area.

Figure 15:
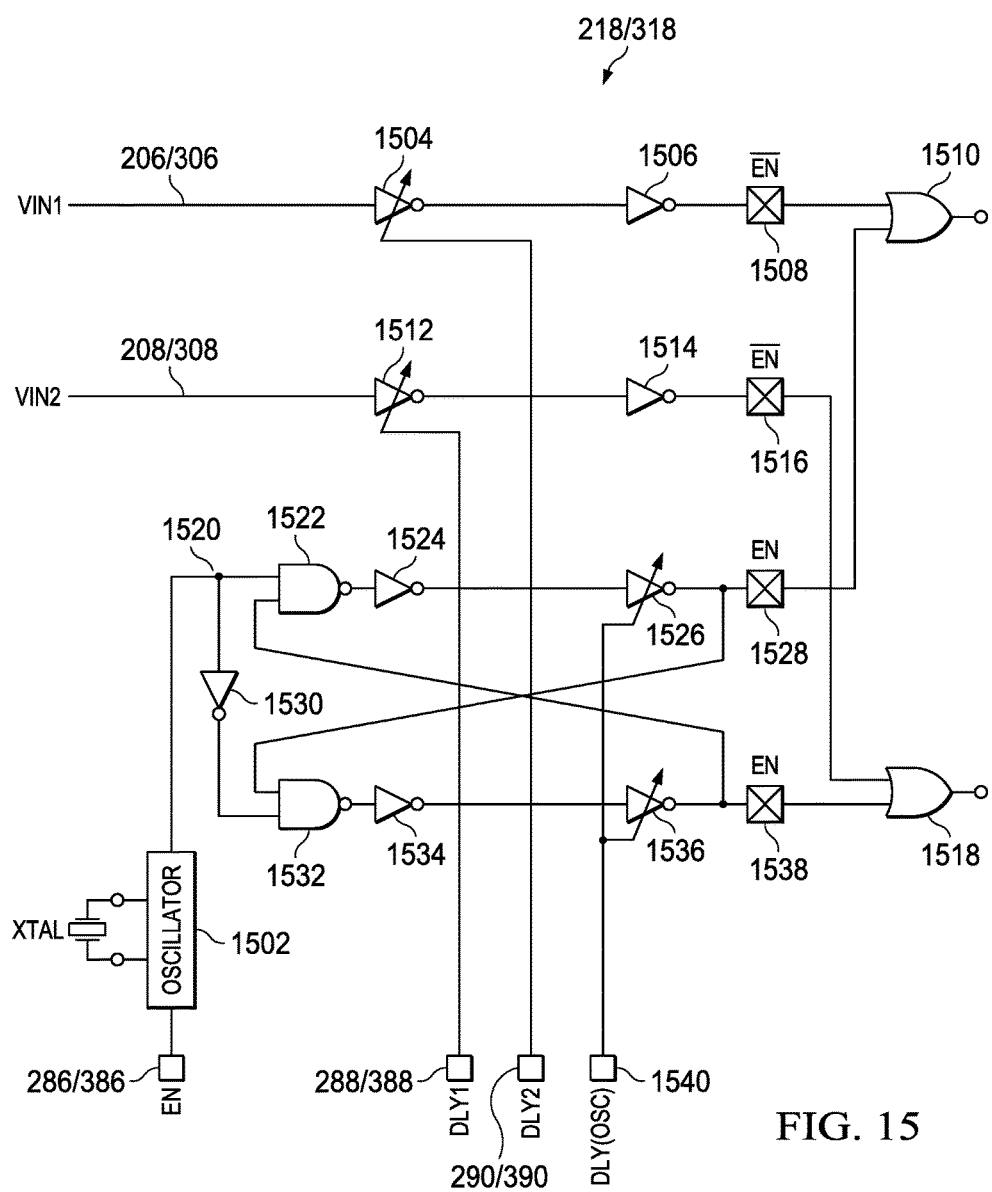
FIG. 15 illustrates a block diagram of the non-overlap circuit.

Referring now to FIG. 15, there is illustrated a schematic diagram of the non-overlap/delay logic circuits 218/318. For the above embodiments, the non-overlap/delay logic circuit 218/318 receives inputs from an external oscillator on the inputs 206/306 and 208/308 or, in the case of internally generated clock signals, from an internal oscillator 1502. The enable input on the pin 286/386 disables the external input and enables the oscillator 1502. When the oscillator 1502 is disabled, inputs 206/306 and 208/308 are enabled.

The input on line 206/306 is input to the input of an inverting delay block 1504, the output of the inverting delay block 1504 input to the input of an inverter 1506, the output thereof input to an enable block 1508, and the output thereof input to one input of an OR gate 1510. The input on line 208/308 is input to the input of an inverting delay block 1512, the output of the inverting delay block 1512 input to an input of an inverter 1514, the output thereof input to an enable block 1516, the output thereof input to one input of an OR gate 1518. The delay blocks 1512 and 1504 will be controlled by the two delay signals on the inputs 288/388 and 290/390, respectively. They can be set to an "equal" delay in the event that the delay for the non-overlap operation is set externally. The two enable blocks 1508 and 1516 are controlled by the enable signal when it is at a "low" logic state.

The oscillator 1502, when enabled, will generate a clock signal at the appropriate frequency. The output of the oscillator 1502 is input to a node 1520. The node 1520 is input to one input of an NAND gate 1522. The output of gate 1522 is input to the input of an inverter 1524, the output thereof input to a programmable delay block 1526 is an inverter. The output of delay block 1526 is input to the input of an enable block 1528, the output thereof connected to the other input of the OR gate 1510. The node 1520 is connected through an inverter 1530 to one input of a NAND gate 1532, the output thereof connected through an inverter 1534 to the input of a programmable delay block 1536, which is an inverter. The output of delay block 1536 is input to an enable block 1538, the output thereof connected to the other input of the OR gate 1518. The output of the delay block 1526 is connected to the other input of the NAND gate 1532 and the output of the delay block 1536 is connected to the other input of the NAND gate 1522. The enable blocks 1528 and 1538 are enabled when the enable input is at a logic "high." The oscillator is also enabled in this mode.

A separate delay input 15 40 is provided for controlling the two delay. Thus, when the oscillator is enabled, the outputs of the delay blocks 1526 and 1536 will be 180° out of phase. These delay blocks 1526 and 1536, as well as the delay blocks 1504 and 1512 are controlled to delay both the positive and negative edges, and delay blocks can be set up to separately control each of the edges of resulting clock pulse, if necessary. The enable blocks will, when disabled, output a logic "low" to the associated OR gate.

Referring back to the embodiments of FIGS. 2 and 3, in these embodiments associated with PFETs and NFETs, it is noted that the high side and low side drivers are "floating" with respect to their power supplies. This means that the transistors associated with each of these high side and low side drivers are disposed in an isolated well. In addition, both the high side and a low side driver are identical such that the delay therethrough, due to the common processing associated with the semiconductor chip, will be virtually identical. Although the delays for the non-overlap operation to prevent shoot through are controlled by the non-overlap/delay logic blocks 218/318, additional delay can be fixed by the delay portion of the level shift/delay blocks 262, 232, 362, 364, 332 and 334. These can be fixed delays or they can be programmable delays. In the embodiment of FIG. 2, the gate drivers 230 and 260 both have their power supply lines disposed in the floating power domain wherein the VDD inputs are connected to the drain of the associated PFET. In the embodiment of FIG. 3 for all NFETs, there are provided separate gate drivers for each transistor, each of which has its VDD input connected to a separate floating external node separate from the drain of the associated transistor.

It will be appreciated by those skilled in the art having the benefit of this disclosure that this multi-mode power train integrated circuit provides a configurable chip having a plurality of gate drivers with galvanically isolated power supplies and driving transistors for being configured in various Class E and Class D configurations. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A configurable driver integrated circuit, comprising:
a plurality of input/output terminals for interfacing exterior of the integrated circuit;
a plurality of driver circuits, each driver circuit including:
a transistor having a source and a drain, and each of the source and drain thereof connected to a dedicated and respective one of the input/output terminals,
a gate driver for driving a gate of the transistor, and having supply inputs associated with a galvanically isolated floating voltage domain, and
a level shift circuit for shifting the level of an input logic signal from a fixed voltage domain to the galvanically isolated floating voltage domain, which galvanically isolated floating voltage domain is galvanically isolated from the fixed voltage domain, the level shift circuit to drive an input of the gate driver in the galvanically isolated floating voltage domain; and
logic circuitry for generating logic signals in the fixed voltage domain for driving the inputs of the level shift circuits and controlling the operation of each of the driver circuits in accordance with a predetermined configuration defined by external circuit components configuring the driver circuits in a predefined driver class to drive a load.

2. The driver integrated circuit of claim 1, wherein the load contains an inductive component.

3. The configurable integrated circuit of claim 1, wherein the transistor for each of the gate drivers comprises an NFET.

4. The configurable integrated circuit of claim 1, wherein the level shift circuit has a programmable delay associated there with.

5. The configurable integrated circuit of claim 4, wherein the level shift circuit is programmable to selectively disable the output thereof.

6. The configurable integrated circuit of claim 1, wherein one of the input/output terminals is connected to a positive and fixed external supply voltage and one of the input/output terminals is connected to a negative and fixed external supply voltage, both the positive and negative fixed external supply voltages existing in the fixed voltage domain.

7. The configurable integrated circuit of claim 1, wherein the gate driver has a negative supply voltage and a positive supply voltage, the negative supply voltage connected to the source of the associated transistor such that both the negative supply voltage of the gate driver and the source of the transistor are connected to the same one of the input/output terminals and wherein the positive supply voltage thereof is connected to a dedicated input/output terminal.

8. The configurable integrated circuit of claim 7, and further comprising a reference voltage generator operating in the fixed voltage domain for generating internal reference voltages to the integrated circuit and wherein, for at least one driver circuit, the associated gate driver circuit has associated there with a first coupling circuit for coupling the positive supply of the gate driver with an internally generated reference voltage when the positive supply of the gate driver is below or at the internally generated reference voltage and, when the supply of the gate driver is above the internally generated reference voltage, the positive supply of the gate driver is uncoupled from the internally generated reference voltage.

9. The configurable integrated circuit of claim 8, wherein, for the at least one driver circuit, the associated transistor has the drain thereof associated with a second coupling circuit for coupling the drain thereof with an internally generated reference voltage when the drain thereof is below or at the internally generated reference voltage and, when the drain thereof is above the internally generated reference voltage, the drain thereof is uncoupled from the internally generated reference voltage.

10. The configurable integrated circuit of claim 9, wherein the first and second coupling circuits are diodes.

11. The configurable integrated circuit of claim 1, wherein the driver circuits are configured into at least first and second driver sets, wherein each of the first and second driver sets is comprised of two driver circuits, with the inputs of the level shift circuits existing in the fixed voltage domain and further comprising a fixed voltage domain gate driver for driving the associated two driver circuits and their level shift circuits in the fixed voltage domain.

12. The configurable integrated circuit of claim 11, and further comprising an input circuit for receiving input drive signals from an external digital circuit for driving the fixed voltage domain gate drivers for each of the first and second driver sets in a complementary fashion.

13. The configurable integrated circuit of claim 11, and further comprising an internal oscillator for generating driving signals for driving the inputs of the fixed voltage domain gate drivers for each of the first and second driver sets in a complementary fashion.

14. A configurable driver integrated circuit, comprising:
circuitry operating in a fixed power supply domain;
a plurality of input/output terminals for interfacing exterior of the integrated circuit and including power supply input terminals interfacing with the fixed power supply domain;
a plurality of isolated driver circuits, each driver circuit including:
a pair of transistors, each having a source and a drain, and each of the source and drain thereof connected to a dedicated and respective one of the input/output terminals,
gate driver circuitry operating in a floating power supply domain relative to the fixed power supply domain for driving a gate of each of the transistors, and
level shift circuitry for shifting the level of an input logic signal from the fixed voltage domain to the floating power supply domain for input to the gate driver in the associated floating voltage domain; and
the circuitry operating in the fixed voltage power supply domain including logic circuitry for generating logic signals in the fixed voltage domain for driving the inputs of the level shift circuit in each of the driver circuits and controlling the operation of each of the driver circuits in accordance with a predetermined configuration defined by external circuit components configuring the driver circuits in a predefined driver class to drive a load.

15. The configurable driver integrated circuit of claim 14, wherein the gate driver circuitry in each of the driver circuits includes:
a first gate driver for driving the gate of a first one of the pair of transistors; and
a second gate driver circuit for driving a gate of a second one of the pair of transistors.

16. The configurable driver integrated circuit of claim 15, wherein the floating power supply domain for each of the driver circuits comprises first and second floating power supplies, one associated with each of the first and second gate drivers and wherein the level shift circuitry comprises a first level shift circuit for shifting the logic level of the input signal to a logic level compatible with the first floating power supply and a second level shift circuit for shifting the logic level of the input signal to a logic level compatible with the second floating power supply.

17. The configurable driver integrated circuit of claim 16, wherein the second gate driver can be disabled.

18. The configurable driver integrated circuit of claim 14, wherein there are two isolated driver circuits, first and second isolated driver circuits, the first isolated driver circuit associated with a first input signal and the second isolated driver circuit associated with a second input signal, wherein the first isolated driver circuit is associated with driving a first side of a load and the second isolated driver circuit is associated with driving a second side of the load circuit wherein the first and second input signals are out of phase with each other.

19. The configurable driver integrated circuit of claim 18, wherein the first input signal is a pulse signal and a second input signal is a pulse signal, wherein there is provided a first delay between a falling edge of the first input signal and a leading edge of the second input signal and a second delay between a falling edge of the second input signal and a leading edge of the first input signal.

* * * * *